US006936154B2

(12) United States Patent
Basol et al.

(10) Patent No.: US 6,936,154 B2
(45) Date of Patent: Aug. 30, 2005

(54) PLANARITY DETECTION METHODS AND APPARATUS FOR ELECTROCHEMICAL MECHANICAL PROCESSING SYSTEMS (75) Inventors: Bulent M. Basol, Manhattan Beach, CA (US); Cyprian E. Uzoh, Milpitas, CA (US)

(73) Assignee: ASM Nutool, Inc., Fremont, CA (US)

( * ) Notice: Subject to any disclaimer, the term of this patent is extended or adjusted under 35 U.S.C. 154(b) by 106 days.

(21) Appl. No.: 10/017,494

(22) Filed: Dec. 7, 2001

(65) Prior Publication Data
US 2002/0134748 A1 Sep. 26, 2002

Related U.S. Application Data
(60) Provisional application No. 60/265,413, filed on Dec. 15, 2000.

(51) Int. Cl.[7] .............................. C25D 5/52; C25D 5/02; H01L 21/288; H01L 21/445
(52) U.S. Cl. ..................... 205/222; 205/123; 205/640
(58) Field of Search ................................ 205/221, 222, 205/123, 157, 640, 81, 82, 87, 91, 92; 204/225, 224 M; 516/13, 18, 37, 38, 88; 438/697, 692; 156/345.13

(56) References Cited

U.S. PATENT DOCUMENTS 5,911,619 A    6/1999  Uzoh et al. ..................... 451/5
6,179,691 B1 * 1/2001  Lee et al. ..................... 451/41

FOREIGN PATENT DOCUMENTS

| EP | 0 738 561 | 10/1996 |
|----|-----------|---------|
| EP | 1 103 346 | 5/2001 |
| WO | WO 01/58643 | 8/2001 |

* cited by examiner

Primary Examiner—Parviz Hassenzadeh
Assistant Examiner—Roberts Culbert
(74) Attorney, Agent, or Firm—Knobbe Martens Olson & Bear LLP (57) ABSTRACT The methods and systems described provide for an in-situ detection of planarity of a layer that is deposited on or etched off the surface of a substrate. Planarity can be detected using various detection mechanisms, including optical, electrical, mechanical and acoustical, in combination with the electrochemical mechanical processing methods, including electrochemical mechanical deposition and electrochemical mechanical etching. Once planarity is detected, a planarity signal can be used to terminate or alter a process that has been previously initiated, or begin a new process. In a preferred embodiment, an optical detection system is used to detect planarity during the formation of planar conductive layers obtained by electrochemical mechanical processing.

32 Claims, 10 Drawing Sheets

PLANARITY DETECTION METHODS AND APPARATUS FOR ELECTROCHEMICAL MECHANICAL PROCESSING SYSTEMS

CROSS REFERENCE TO RELATED APPLICATIONS

The present application is based on, and claims priority from, U.S. Provisional Application No. 60/265,413 filed Dec. 15, 2000 entitled "Disturbed Boundary Layer Materials Deposition Method and Apparatus."

FIELD OF THE INVENTION

The present invention relates to the manufacture of semiconductor integrated circuits and more particularly to planarity detection methods and apparatus for use in planar deposition and etching of conductive layers.

DESCRIPTION OF THE RELATED ART

Conventional semiconductor devices generally include a semiconductor substrate, usually a silicon substrate, and a plurality of sequentially formed dielectric interlayers such as silicon dioxide and conductive paths or interconnects made of conductive materials. Copper and copper alloys have recently received considerable attention as interconnect materials because of their superior electromigration and low resistivity characteristics. The interconnects are usually formed by filling copper in features or cavities etched into the dielectric interlayers by a metallization process. The preferred method of copper metallization process is electroplating. In an integrated circuit, multiple levels of interconnect networks laterally extend with respect to the substrate surface. Interconnects formed in sequential interlayers can be electrically connected using vias or contacts.

In a typical process, first an insulating interlayer is formed on the semiconductor substrate. Patterning and etching processes are performed to form features such as trenches and vias in the insulating layer. Typically the width of the trenches is larger than the width of the vias. Then, copper is electroplated to fill all the features. However, the plating process results in a thick copper layer on the substrate, some of which need to be removed before the subsequent step.

Figure 1A:
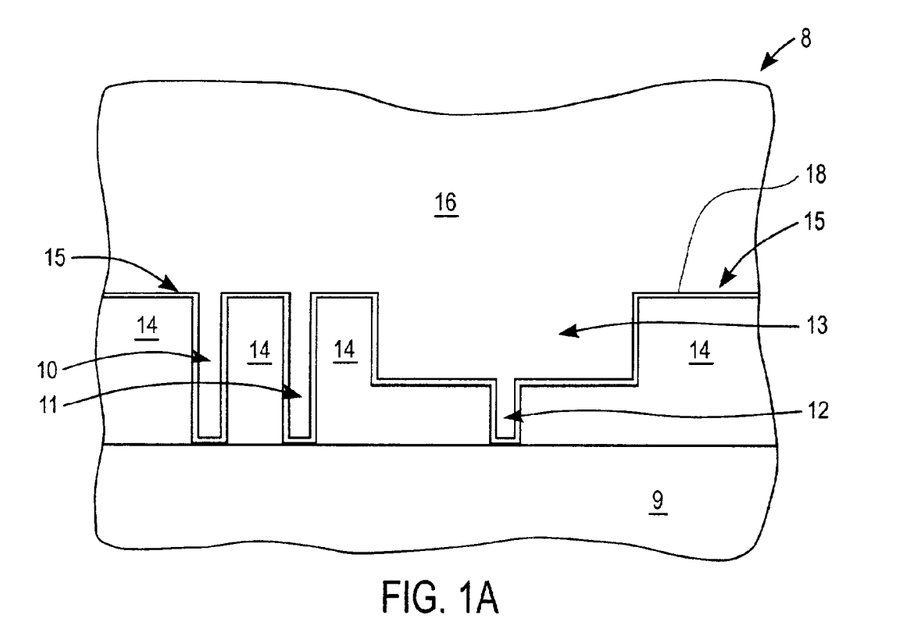
FIG. 1A is a diagram illustrating a cross-sectional view of an exemplary substrate following deposition of material onto the surface of the substrate.

FIG. 1A shows an exemplary portion 8 of such plated substrate 9, for example a silicon wafer. As shown in FIG. 1A, vias 10, 11 and 12 as well as a trench 13 are formed in an insulation layer 14, such as a silicon dioxide layer, that is formed on the substrate 9. The vias 10,12 and the trench 13 as well as surface 15 of the insulation layer 14 are covered and filled with a copper layer 16 through electroplating process. Conventionally, after patterning and etching, the insulation layer 14 is first coated with a barrier layer 18, typically, a TaN or Ta/TaN composite layer. The barrier layer 18 coats the vias and the trench as well as the surface of the insulation layer to ensure good adhesion and acts as a barrier material to prevent diffusion of the copper into the semiconductor devices through the insulation layer. Next a seed layer (not shown), which is often a copper layer, is deposited on the barrier layer. The seed layer forms a conductive material base for copper film growth during the subsequent copper deposition. As the copper film is electroplated, the copper layer 16 quickly fills the vias 10, 12 but coats the wide trench 13 and the surface 15 in a conformal manner. When the deposition process is continued to ensure that the trench is also filled, a thick copper layer or overburden is formed on the substrate 9. Conventionally, after the copper plating, CMP process is employed to globally planarize or reduce the thickness of the copper layer down to the level of the surface of the insulation layer. However, a CMP process is a costly and time consuming process that reduces production efficiency.

The adverse effects of conventional material removal technologies may be minimized or overcome by employing a processing approach that has the ability to provide thin layers of planar conductive material on the workpiece surface, or even provide a workpiece surface with no or little excess conductive material. These planar deposition and removal processes also have application in thru-resist processes employed in IC manufacturing. In these applications plating is performed into holes opened in resist layers, onto the seed films exposed on the bottom of each hole or opening as will be discussed in more detail later.

The term of Electrochemical Mechanical Processing (ECMPR) is used to include both Electrochemical Mechanical Deposition (ECMD) processes as well as Electrochemical Mechanical Etching (ECME), which is also called Electrochemical Mechanical Polishing. It should be noted that in general both ECMD and ECME processes are referred to as electrochemical mechanical processing (ECMPR) since both involve electrochemical processes and mechanical action.

In one aspect of an ECMPR process, a workpiece-surface-influencing-device (WSID) such as a mask, pad or a sweeper is used during at least a portion of the electrotreatment process when there is close proximity, either physical contact or a slight spacing, with physical contact preferred, and relative motion between the workpiece surface and the WSID. Descriptions of various planar deposition and planar etching methods i.e. ECMPR approaches and apparatus can be found in the following patents and pending applications, all commonly owned by the assignee of the present invention. U.S. Pat. No. 6,176,992 entitled "Method and Apparatus for Electrochemica Mechanical Deposition." U.S. application Ser. No. 09/740,701 entitled "Plating Method and Apparatus that Creates a Differential Between Additive Disposed on a Top Surface and a Cavity Surface of a Workpiece Using an External Influence," filed on Dec. 18, 2000, and U.S. application Ser. No. 09/961,193 filed on Sep. 20, 2001, entitled "Plating Method and Apparatus for Controlling Deposition on Predetermined Portions of a Workpiece". These methods can deposit metals in and over cavity sections on a workpiece in a planar manner. They also have the capability of yielding novel structures with excess amount of metals selectively over the features irrespective of their size, if desired.

In ECMD methods, the surface of the workpiece is wetted by the deposition electrolyte which is also in fluid contact with an electrode (anode) and a potential is applied between the surface of the workpiece and the electrode rendering the workpiece surface cathodic. Thus deposition takes place onto the workpiece surface. In ECME methods, the surface of the workpiece is wetted by the deposition electrolyte or a special etching electrolyte, which is also in fluid contact with an electrode (cathode) and a potential is applied between the surface of the workpiece and the electrode rendering the workpiece surface anodic. Thus etching takes place from the workpiece surface. Very thin planar deposits can be obtained by first depositing a planar layer using an ECMD technique and then using an ECME technique on the planar film in the same electrolyte by reversing the applied voltage. Alternately the ECME step can be carried out in a separate machine and a different etching electrolyte. The thickness of the deposit may be reduced in a planar manner. In fact, an ECME technique may be continued until all the metal on the field regions is removed. It should be noted that a WSID may or may not be used during the electroetching process since substantially planar etching can be achieved either way. However, if WSID is used the process is referred to as ECME.

As stated above, in ECMD methods the surface of the workpiece is wetted by the electrolyte and is rendered cathodic with respect to an electrode, which is also wetted by the electrolyte. This results in material deposition on the surface of the workpiece. During ECMD, the wafer surface is pushed against the surface of the WSID or vice versa when the surface of the workpiece is swept by the WSID. Planar deposition is achieved due to this sweeping action as described in the above-cited patent applications.

Figure 1B:
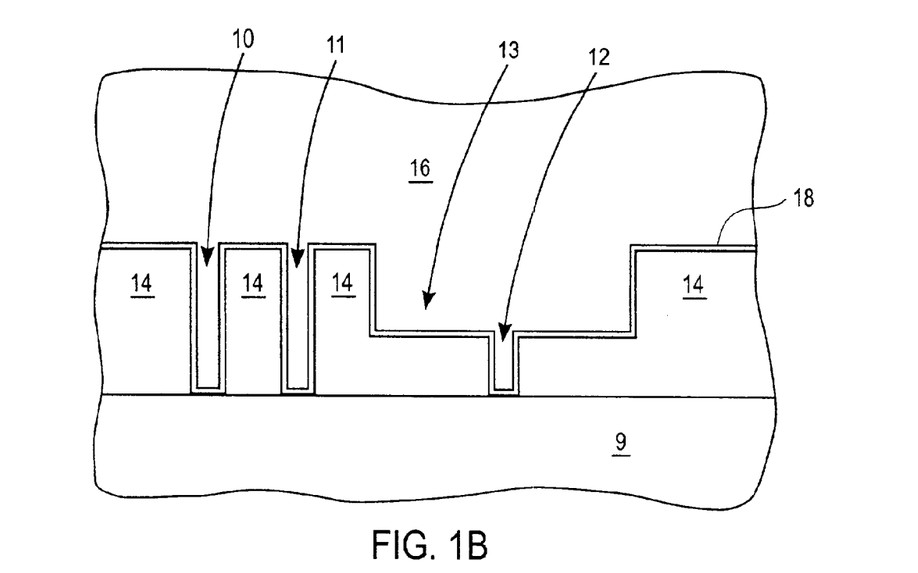
FIG. 1B is a diagram illustrating a cross sectional view of the exemplary substrate of FIG. 1 following a conventional ECMD process.

As shown in FIG. 1B, ECMD process yields nearly planarized and relatively thin deposition layers that cannot be obtained using conventional electroplating techniques. In comparison to the surface shown in FIG. 1A, the surface of the copper layer 16 in FIG. 1B is relatively planar and would need a shorter CMP process time. Further, if the plating process is stopped as soon as the planar layer is formed, i.e. a planar plating endpoint is reached, time for the plating as well as CMP processes can be minimized. That this planar plating endpoint is reached has been determined by removing the substrate from the ECMD apparatus and measuring the thickness of the copper layer ex-situ to see if the desired end point has been reached. Alternately, some "set-up" substrates are processed using different amounts of charge during planar deposition. By evaluating the results, the minimum amount of charge necessary for a desired level of planarization can be determined.

In ECME processes the etching time necessary to remove substantially all of the top conductive material from the field regions is estimated beforehand by using set-up substrates. These approaches are time consuming and expensive and they reduce the throughput and repeatability of the processes.

Therefore, there is a need for effective and in-situ planarity and end point detection methods in ECMPR technologies.

SUMMARY OF THE INVENTION

The present invention advantageously provides an in-situ method and apparatus for determining the planarity of a layer.

In certain embodiments, the methods and systems described provide for an in-situ detection of planarity of a layer that is deposited on or etched off the surface of a substrate. Planarity can be achieved in a number of manners, including the elimination of surface roughness that is caused by variations in the top surface as a result of features or cavities disposed below or a finer degree of planarity in which the surface roughness that can be tolerated is sufficiently less than that which could be present and still avoid surface roughness caused as a result of below-disposed features.

Planarity can be detected using various detection mechanisms, including optical, electrical, mechanical and acoustical, in combination with the electrochemical mechanical processing methods, including electrochemical mechanical deposition and electrochemical mechanical etching. Once planarity is detected, a planarity signal can be used to terminate or alter a process that has been previously initiated, or begin a new process, as will be described further hereinafter.

In a preferred embodiment, an optical detection system is used to detect planarity during the formation of planar conductive layers obtained by electrochemical mechanical processing.

BRIEF DESCRIPTION OF THE DRAWINGS

The foregoing and other features, aspects, and advantages will become more apparent from the following detailed description when read in conjunction with the following drawings, wherein.

DETAILED DESCRIPTION OF THE PREFERRED EMBODIMENTS

As will be described below, the present invention provides methods and systems for an in-situ detection of planarity of a layer that is deposited on or etched off the surface of a substrate such as a semiconductor. In the context of this application, planarity can be described as having been achieved when a given layer no longer has significant roughness on the surface of the layer. Significant surface roughness can vary, depending on the application. In certain applications, surface roughness that is caused by variations in the top surface as a result of features or cavities disposed below are required to be eliminated. In other applications, a finer degree of planarity is necessary, and thus the surface roughness that can be tolerated is sufficiently less than that which could be present and still avoid surface roughness caused as a result of below-disposed features. Planarity can be detected using various detection means such as optical, electrical, mechanical and acoustical. For electroetching applications in addition to planarity, the nature of the material on the workpiece surface may also change, indicating planarity by detection of a different layer than the one being etched, as will be discussed later. Once planarity is detected, a planarity signal can be used to terminate or alter a process that has been previously initiated, or begin a new process, as will be described further hereinafter.

In a preferred embodiment, an optical detection system of the present invention will be used to detect planarity during the formation of planar conductive layers by an ECMPR approach. The preferred embodiment will now be described using the example of fabricating copper interconnects for integrated circuit applications. It should, however, be recognized that the planarity detection system of the present invention can be used during the filling process of the cavities on any workpiece with various electroplated materials such as Au, Ag, Ni, Pt, Pd, Fe, Sn, Cr, Pb, Zn, Co and their alloys with each other or other materials, for many different applications such as packaging, flat panel displays, magnetic heads and such. As will be exemplified below, some of these applications involve thru-mask deposition where the conductor is deposited directly and selectively into features opened in insulators or masks on workpiece surfaces rather than all over the surface of the workpiece.

Figure 2A:
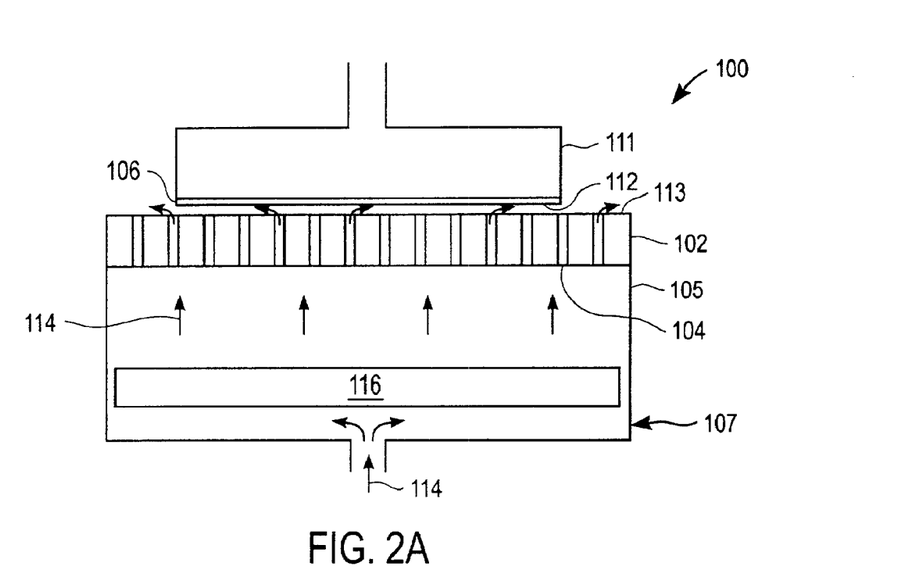
FIGS. 2A–2B are diagrams illustrating cross sectional side views of an exemplary ECMPR system according to a presently preferred embodiment used for processing workpieces such as wafers.
Figure 2B:
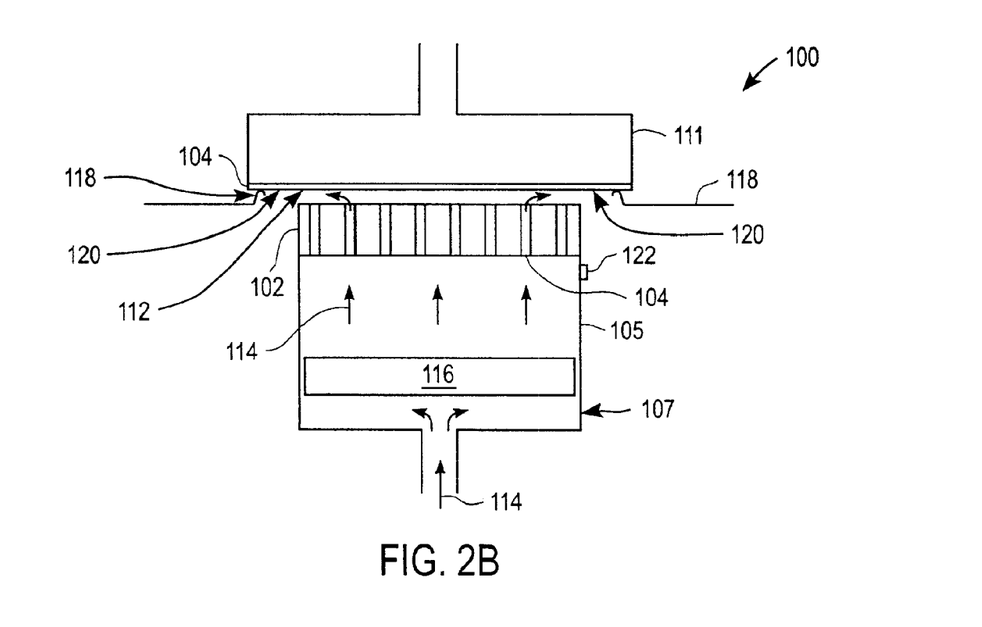

Reference will now be made to the drawings wherein like numerals refer to like parts throughout. FIGS. 2A and 2B are schematic side views of an exemplary ECMPR system 100 used for processing wafers. In FIG. 2A, a workpiece-surface-influencing device (WSID) 102, which may or may not have openings 104 in it, is disposed in close proximity of a workpiece or wafer 106 to be processed. In this embodiment, the WSID 102 may be supported by the sidewall 105 of an electrolyte container 107. As will be exemplified below, WSIDs can have different configurations. WSIDs can be designed as a pad or shaping plate, belt, wand or wiper, or other configurations. The wafer 106 may be a silicon wafer to be plated with a conductor metal, preferably copper or copper alloy. The wafer 106 is retained by a wafer carrier 111 so as to position front surface 112 of the wafer against top surface 113 of the WSID 102. The openings 104 are generally designed to assure uniform application of solution, depicted by arrows 114, onto the front surface 112. Instead of discrete openings, a WSID that is porous may also be used, in which case the opening are the pores. In special circumstances, a specific deposit thickness profile such as an edge-thick profile or an edge-thin profile may be desired. In these cases the openings 104 are designed to yield these profiles. As the name suggests in edge-thick profile the thickness of the conductive material gets larger going from the center towards the edge of the workpiece. In edge-thin profile the reverse is true.

In any case, the top surface 113 of the WSID 102 facing the front surface 112 of the wafer is used as the sweeper and the WSID 102 itself establishes good electrolyte flow and electric field flow to the front surface 112 for controlled deposition or etching. ECMPR system 100 also includes an electrode 116, which is immersed in the solution 114 that is contained in the container 107. The solution 114 is in fluid communication with the electrode 116 and the front surface 112 of the wafer 106 through the openings 104 in the WSID 102. The electrode 116 is typically a Cu piece for ECMD of copper films or the electrode 116 may also be an inert electrode made of, for example, Pt coated Ti, particularly in an ECME application.

An exemplary solution 114 that is particularly usable in ECMD applications of copper or combined ECMD and ECME applications of copper may be a copper electrolyte solution of copper sulfate with additives such as accelerators, suppressors, and chloride ions, which are commonly used in the industry. Additionally, levelers may be added in small quantities, although ECMD process does not typically need leveler since it does leveling of the deposited film automatically. Leveler may be added, if needed, however, for optimization of other process results such as gap fill etc. The top surface 113 of the WSID 102 sweeps the front surface 112 of the wafer while an electrical potential is established between the electrode 116 and the front surface 112 of the wafer. For deposition of a planar film such as copper, the front surface of the wafer 102 is made more cathodic (negative) compared to the electrode 116, which becomes the anode. The surface of the WSID preferably contains hard-abrasive material for efficient sweeping. Fixed abrasive pads which are supplied by companies such as 3M and which are commonly used in CMP applications work efficiently on WSID surfaces. For electroetching in the same ECMPR system, the wafer surface is made more anodic than the electrode. For ECME processing without ECMD, the solution 114 may preferably be an etchant.

As stated above, during the ECMPR an electrical potential is established between the front surface of the wafer and the electrode. In order to establish this potential, as shown in FIG. 2B, the front surface 112 of the wafer is connected to a power source (not shown) through contacts 118 touching and sliding on a peripheral region 120 of the front surface 112 of the wafer 106. In order to expose the peripheral region 120 as the wafer is rotated, in one embodiment, the width of the WSID is kept shorter than the diameter of the wafer 106.

The planarity detection method of one of the preferred embodiments of the present invention involves detection of a change in reflected light intensity, which intensity change is associated with a change in the planarity of the substrate. In this embodiment, by employing suitable detection devices, the detection process may be performed on wafer 106 as it is plated, such as at the peripheral edge region 120 of the wafer 106. If the WSID is of a type that covers a substantial portion of the wafer 106, openings within the WSID can be used to perform detection on the portion of the wafer that is below the openings. In the case of a detection process that uses light, for example, light can pass through an opening or openings, through the solution, be reflected off of the wafer 106, and again pass through the solution and the opening or openings and then be detected. If a portion of the wafer 106 needs to be exposed and an opening or openings do not exist in the WSID, this exposure can occur by having a portion of the wafer 106 not covered the WSID, or relatively moving the wafer 106 and the WSID with respect to each other to expose a portion of the wafer 106 for detection.

Figure 3:
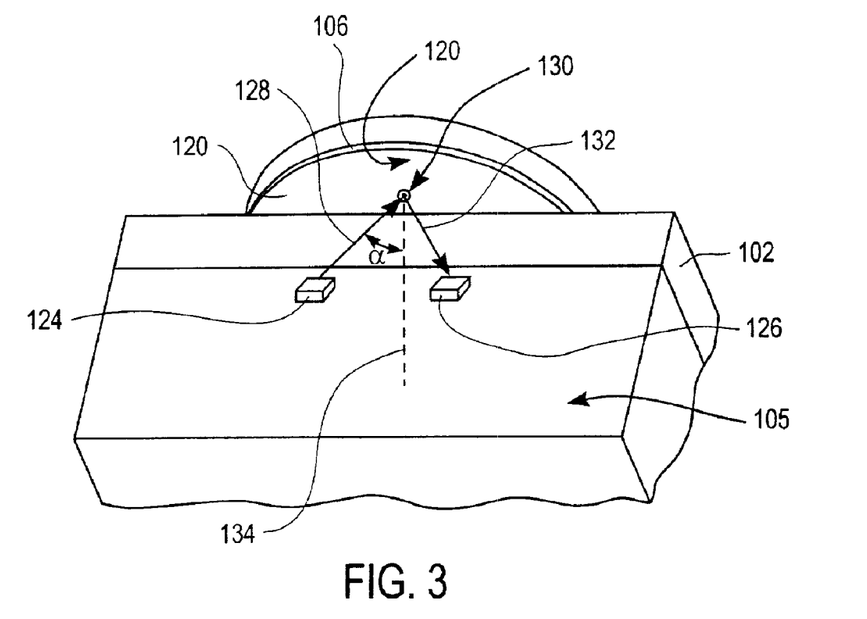
FIG. 3 is a diagram illustrating a partial perspective view of the exemplary ECMPR system having a planarity detection system secured to the side walls.

As shown in FIG. 2B and in partial perspective view in FIG. 3, a planarity detection system 122 may be secured on the side walls 105 of the container, below the WSID 104, or secured in a location below the level of the wafer surface by any other mean. The detection system 122 may have at least one light source 124 and at least one light sensor 126 as can be seen in FIG. 3 which is a view in the direction "dir"

indicated by arrow in FIG. 2B. The light source 124 generates an optical beam 128 to impinge the front surface 112 at an impingement zone 130, with an incidence angle "α". Depending on the nature of the input beam the impingement zone can be very small or relatively large. It may typically change from 1 mm² to 1 cm². Similarly, the angle "α" may be very small. In fact, typical systems have light source 124 and light sensor 126 in a single body right next to each other. These systems measure vertical or near vertical reflection from the substrate surface. For ease of explaining and illustration, however, the angle will be illustrated as the relatively large angle "α" as shown in FIG. 3. The input optical beam 128 is reflected by the front surface and forms a reflected or output optical beam 132. The output beam 132 is received by the sensor 126 of the detecting system 122 and will produce a signal associated with the sensed reflected beam at various points in time that is used determine planarity. In particular, the signal contains information indicative of the planarity of the top conductive layer, typically an intensity value that exceeds a predetermined threshold value.

Figure 4:
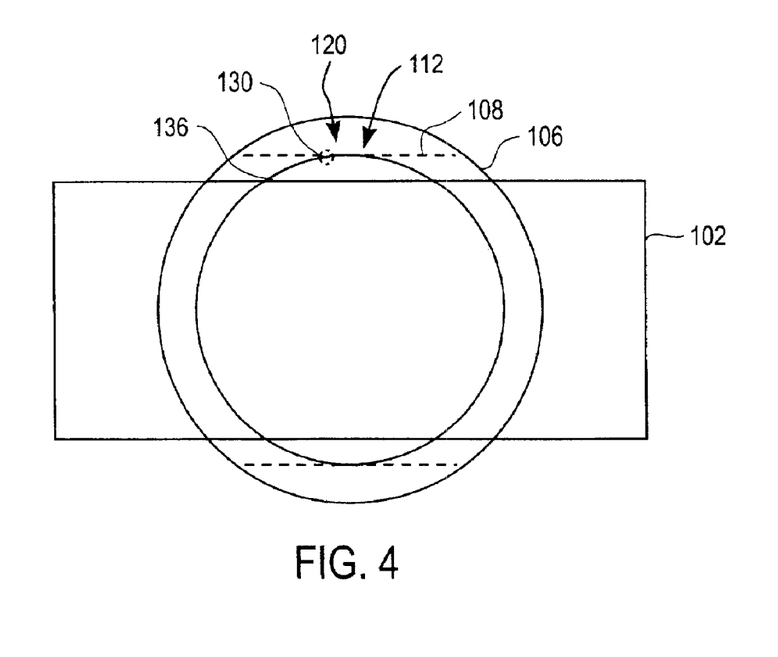
FIG. 4 is a diagram illustrating a bottom view of the exemplary ECMPR system of FIGS. 2B and 3.

In this embodiment, the source 124 and the sensor is preferably located symmetrically around a surface axis 134, which surface axis 134 is normal to the surface 112 at impingement zone 130. As shown in a bottom view, in FIG. 4, it will be appreciated that the impingement zone is not a fixed region on the surface, rather it may be for example a point on a first sampling track 136 and a second sampling track 138. The second sampling track 138 represents the straight sampling route that the input beam impinges on as the wafer 104 is moved laterally. The first sampling track 136 represents the circular sampling routes followed by the impinging beam when the wafer 104 is rotated either applying a lateral motion or not. If both motions, lateral and rotational, are given together, the peripheral edge region 120 is completely scanned.

Referring back to FIG. 3, the input beam is projected from the source 124 at an angle of incidence α from the surface axis 134. The angle of incidence α may be in the range of 0–60 degrees. The light source is preferably one that generates a beam of white light and a the sensor senses the intensity of the reflected white light. It is also possible to use a white light nput, but a sensor that measures only a predetermined wavelength of the reflected white light. Alternatively, the light source may generate a beam of light with a predetermined single or multiple wavelengths, and the sensor may be provided to sense the intensity of the sensed light at least at that predetermined wavelength or multiple wavelengths. The single wavelength used is preferably that wavelength providing the highest signal for the material being planarized, as each material reflects different wavelengths differently.

Figure 5:
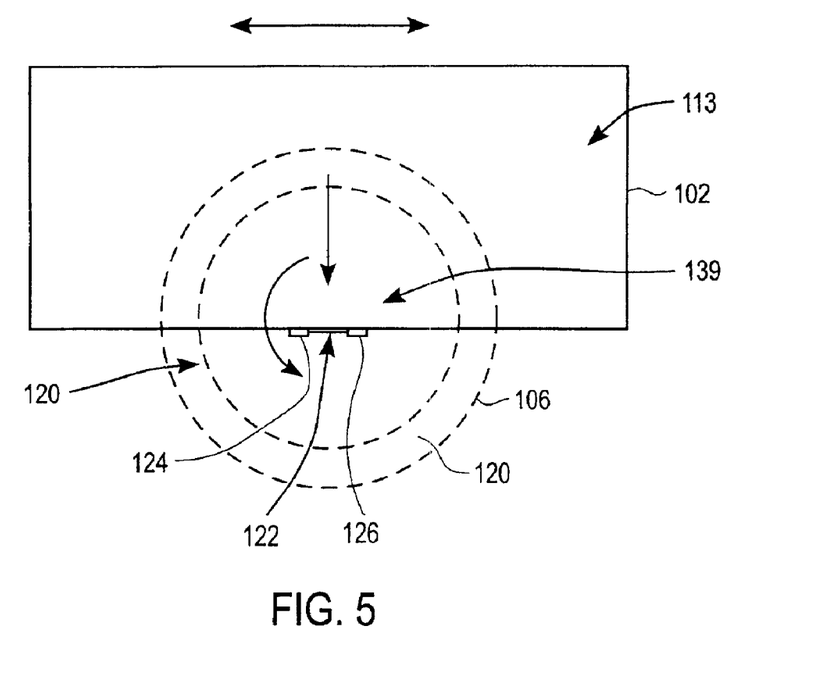
FIG. 5 is a diagram illustrating a top view of the exemplary ECMPR system including the planarity detection system.

As shown in FIG. 5 in top view, alternatively, the ECMPR system 100 may be so equipped that the wafer 106 may be periodically moved over the detection system 122 to monitor a central region 139 of the wafer during the process in addition to the monitoring of the edge regions as explained before.

Figure 6:
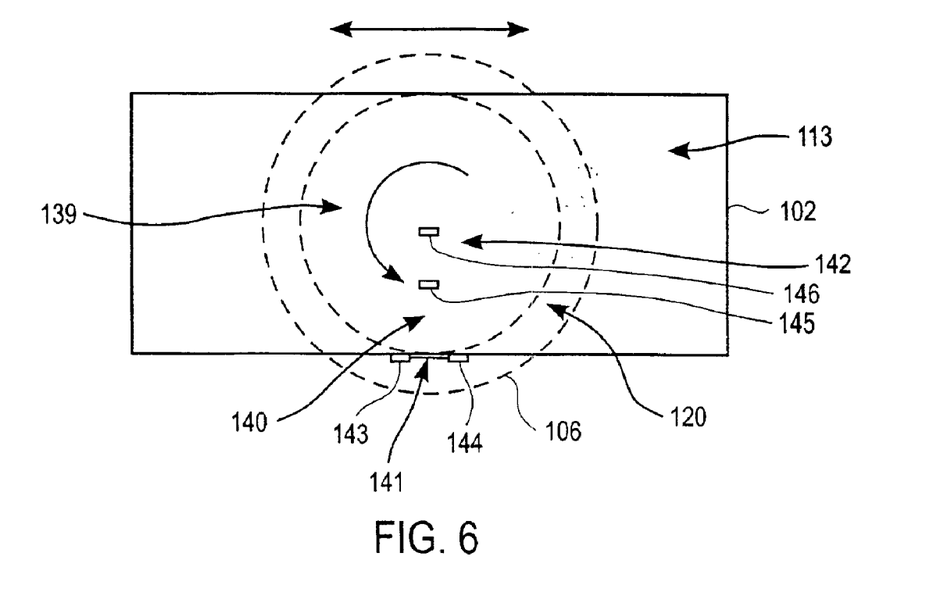
FIG. 6 is a diagram illustrating a top view of the exemplary ECMPR system including an alternative exemplary planarity detection system.

As illustrated in FIG. 6, an alternative detection system 140 may monitor the peripheral and central regions 120, 139 at the same time. The system 140 may comprise a first set of detection means 141 and a second set of detection means 142. The first set of detection means 141 comprises a first light source 143 and a first sensor 144, and the second set of detection means 142 comprises a second light source 145 and a second sensor 146. During the operation, the first set of detection means 141 monitors the edge region 120 of the wafer while the second set of detection means 142 monitors the central region 139 of the wafer 106. Other variations of placing the planarity detection systems in the ECMPR system are also within the intended scope of the invention.

In use, ECMPR system 100 may use the exemplary detection system 122 to determine if the desired end-point of a particular process is reached. The desired endpoint is typically the point where the deposited layer is planar, so that another process can then be initiated, though that is not necessarily the case. Alternately, the desired end point may be when the excess metal is etched off from a non-planar surface of the workpiece, or when excess metal is etched off until a layer disposed below the metal being etched is exposed.

Figure 7:
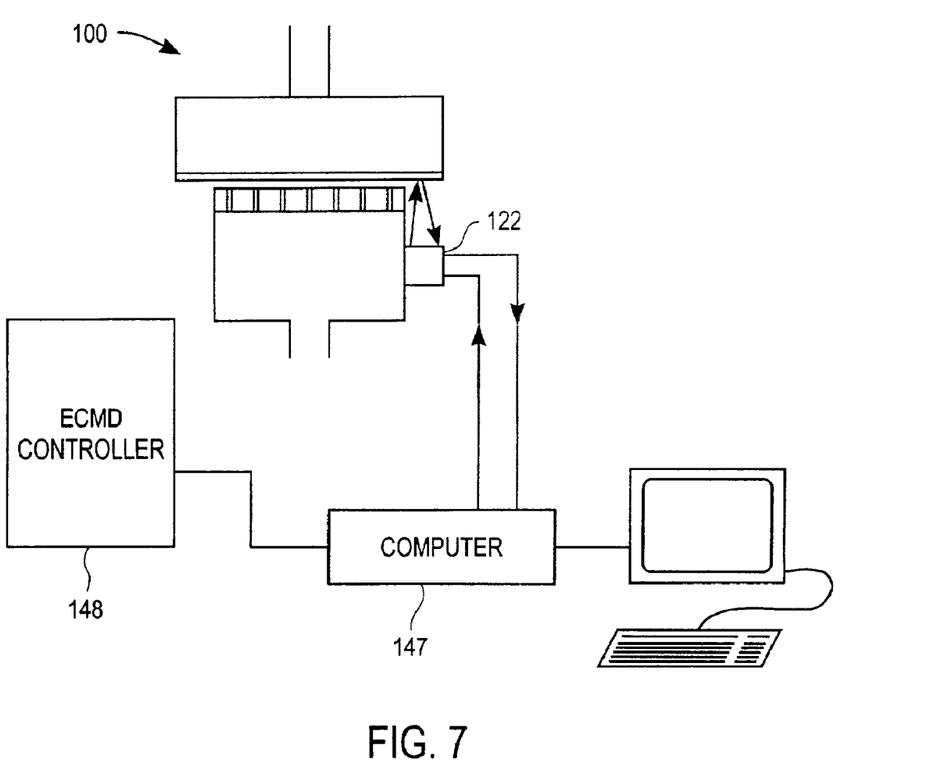
FIG. 7 is a diagram illustrating an exemplary control system for detection system according to aspects of the present invention including a computer and an ECMPR controller.

In any case, as shown in FIG. 7, the detection system can be connected to a computer 147 which computer is also connected to a ECMPR controller 148, although it is understood that the computation could be performed in many manners, and need not necessarily require a computer with a processor, but instead could use discrete or integrated logic circuits, including but not limited to ASICS and programmable gate arrays. During operation, when the desired planarity or end-point is reached, the detector output signal from the detector 122 changes. Thus, by continuously monitoring the detector output signal, the computer 147 can generate a planarity or endpoint signal and provide that signal to the ECMPR controller 148 to halt the particular ECMPR process at the appropriate time. Another process may then take place.

Figure 8A:
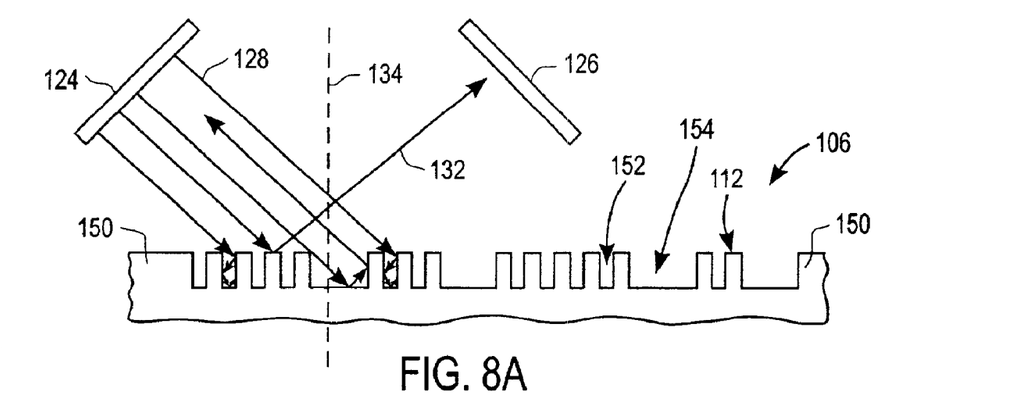
FIGS. 8A–8C are diagrams illustrating a cross-sectional view of an exemplary substrate during an ECMD process incorporating an exemplary detection process according to aspects of the present invention.
Figure 8B:
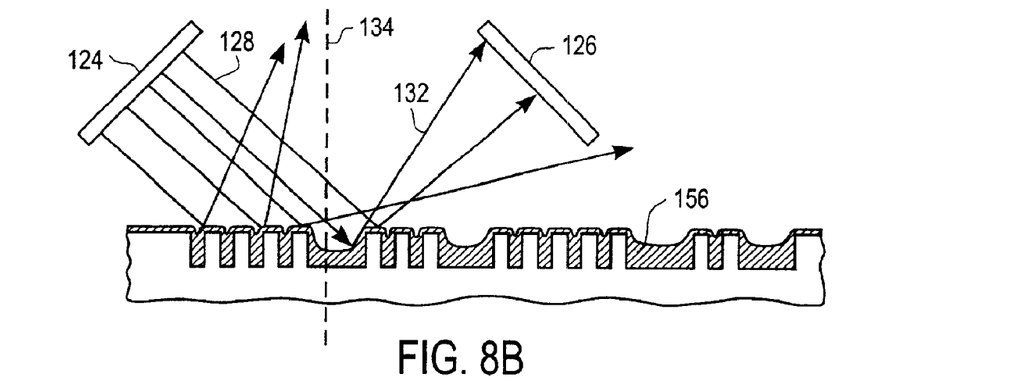
Figure 8C:
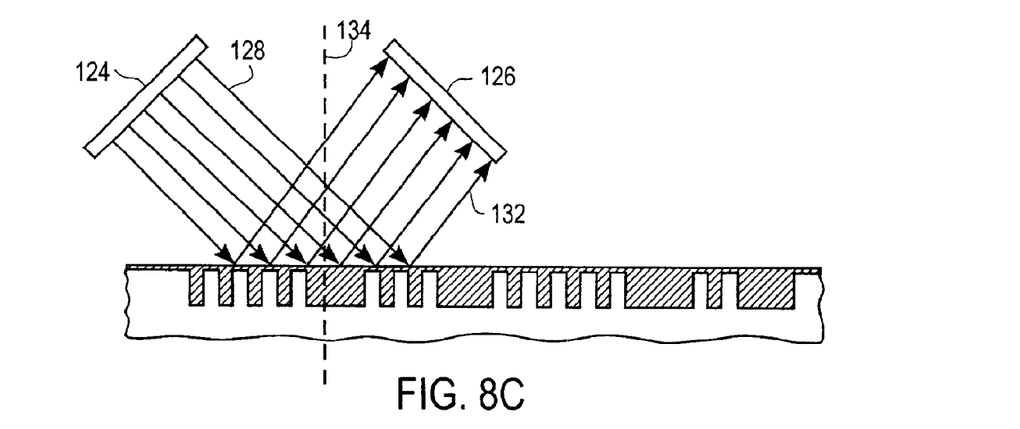

One embodiment of the detection process of the present invention based upon plating using ECMD will now be described with the help of FIGS. 8A through 8C. FIG. 8A shows a portion of the wafer 106 and a front surface 112 in a highly magnified state. The front surface 112 of the wafer 106 typically includes an insulating layer 150, such as silicon oxide, which is etched and patterned to form features such as vias 152 and trenches 154. The insulating layer 150 is also coated with a barrier layer Ta or TaN and then coated with a copper seed layer, which are not shown for the purpose of clarity. It should be noted that the invention is usable even for the case of filling features opened in a conductive rather than insulating surfaces for other applications. As shown in FIG. 8A, the columnated input beam from the source 124 arrives at the front surface 112 and is reflected. Since the front surface 112 is rough due to the presence of the vias and trenches and other features, the reflected or output beam is not columnar but is rather scattered. Only a portion of the output beam 132 reaches the sensor 126. Therefore, intensity of the reflected beam that can be detected by the sensor 126 is very low. Since the input beam has a predetermined intensity, an intensity loss, which is detected by the sensor 126, indicates the surface roughness. The ECMD process is initiated to plate copper onto the front surface 112. As shown in FIG. 8B, as a copper layer 156 fills the features 152, 154 and covers the front surface 112, more of the output beam 132 arrives at the sensor 126. Thus, the intensity difference between the input beam and the output beam is not as large as in the previous case shown in FIG. 8A. As shown in FIG. 8C, however, as the copper layer becomes planar, indicating that features are filled in if that is the planarity desired, the output beam 132 that is detected by the sensor 126 substantially increases, indicating planarization has been achieved and that the end-point has been reached. At his time, the ECMD process is halted. Another process, such as ECME or CMP can then be initiated, if desired.

Figure 9A:
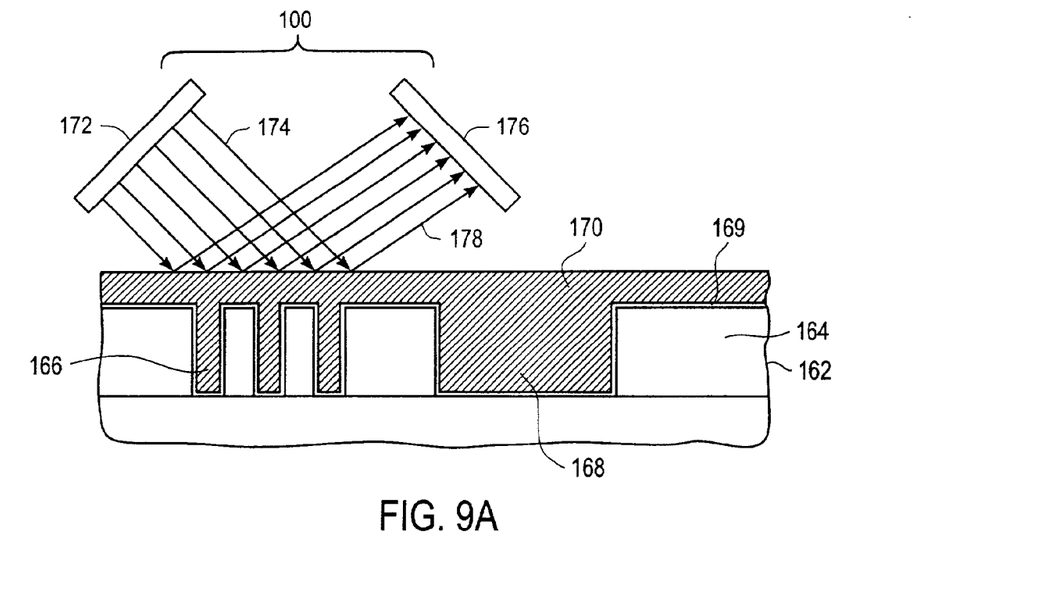
FIGS. 9A–9B are diagrams illustrating a cross-sectional view of an exemplary substrate during an ECME process incorporating an exemplary detection process according to aspects of the present invention.
Figure 9B:
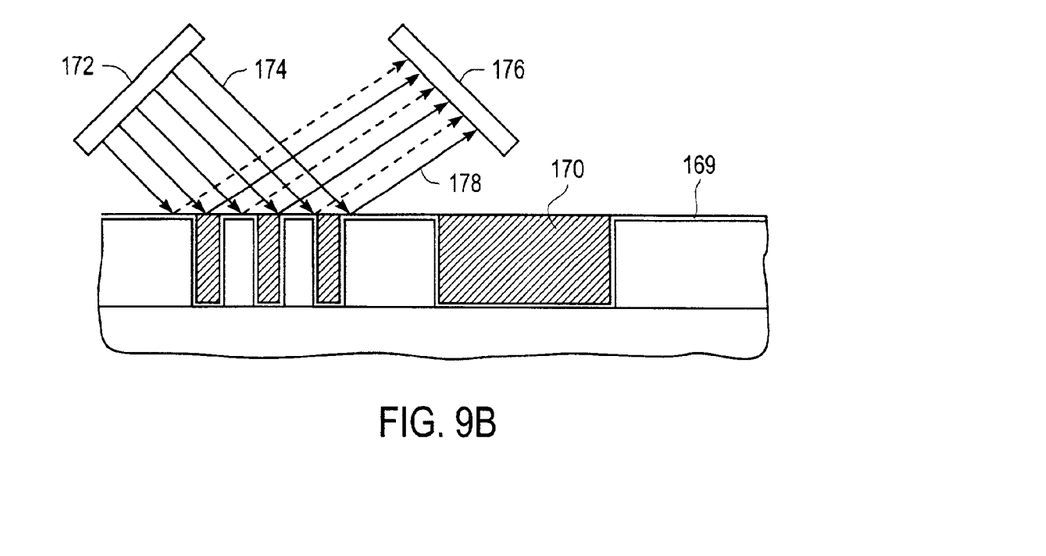

FIGS. 9A–9B illustrate an alternative detection system 160 that is used during an ECME process which is employed to etch a conductive layer or layers. As shown in FIG. 1A, features 166 and 168 are etched into isolation layer 164. A barrier layer 169 such as Ta or TaN, and a copper seed layer (not shown) are then coated over the surface. A copper layer 170 fills the features and covers substrate 162. The copper layer 170 may have been obtained as a result of conventional deposition techniques, or a combination of ECMD and conventional deposition techniques. The detection system 160 comprises a light source 172 generating an input beam 174 and a sensor 176 to receive reflected or output beam 178. In this embodiment the sensor 176 also measures change in the intensity of the reflected beam.

If the starting film is not planar and only planarity is desired as a result of ECME process, then the sensor 176 can operate as described above with respect to deposition of a material, such that once the desired degree of planarity is achieved, the reflected beam intensity increases and the process can be halted.

If, however, removal of a layer is desired, then the optical reflectivity characteristics of the barrier material and the copper, which are different, can be used so that the sensor 176 can advantageously detect the barrier layer, which exposure provides the endpoint. As shown in FIGS. 9A–9B, as the copper layer 170 is etched back in a planar fashion using ECME, the intensity difference between the input and output beams is minimal, which suggests etching is planar and the material is still copper. In FIG. 9A, before the exposure of the underlying barrier layer, detected reflectivity characteristics of the copper layer 170, from the output beam 178, approximates a constant value. However, once the barrier layer is exposed, as shown in FIG. 9B, detected reflectivity characteristics abruptly changes, indicating the exposure of barrier layer 169. For example using a light with a wavelength of about 690 nm, reflected light intensity drops as materials changes from Cu to Ta.

Figure 10A:
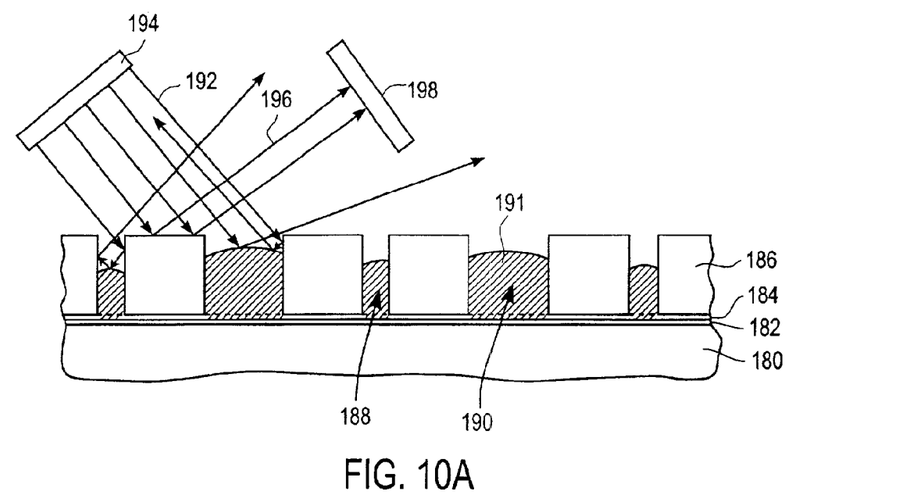
FIGS. 10A–10B are diagrams illustrating a cross-sectional view of an exemplary substrate during an ECMD process incorporating an exemplary detection process according to aspects of the present invention.
Figure 10B:
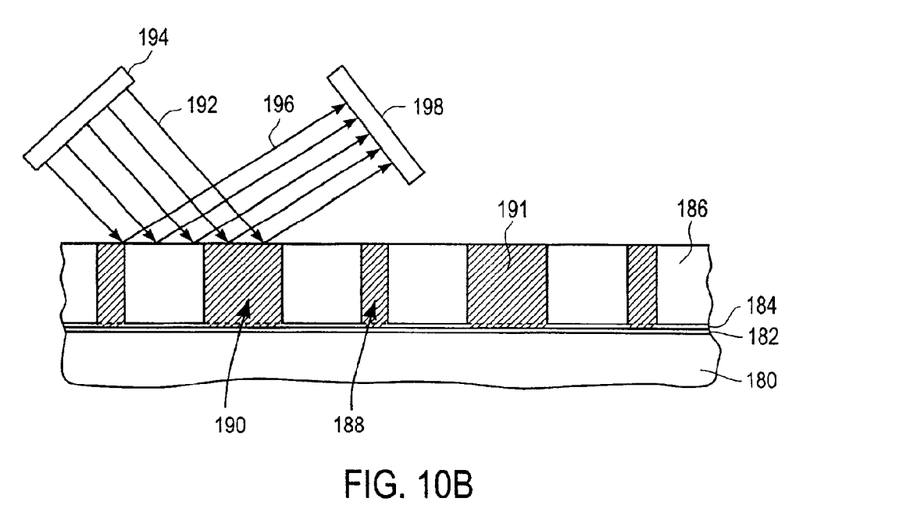

The present invention can also be used during manufacture of conductive networks requiring formation of narrow and large gaps through a mask layer coated on a substrate and filling them with a conductive material such as copper using the ECMD process. One such example is described in U.S. application Ser. No. 10/282,976, entitled Method and Structure for Thru-Mask Contact Electrodeposition, filed on Oct. 28, 2002, owned by the assignee of the present invention. As shown in FIGS. 10A–10B, a substrate 180 is first coated with a barrier layer 182 and then with a copper seed layer 184. A resist layer 186 is formed on the seed layer 184 and defined and etched to form various features such as vias 188 and trenches 190. The resist material may be soft or hard baked organic materials, it could be inorganic materials such as silicon oxide, alumina, sapphire or another material. The resist material may also be a low or high dielectric constant material. In the context of this embodiment, a resist material is hereby defined as that material that copper or any metal of interest will not nucleate on without a seed layer coating. Similar to the embodiment described with FIGS. 8A–8C, FIG. 10A shows features that are partially filled using the ECMD process. In this embodiment as the features 188, 190 are filled with a copper layer 191, input beam 192 from a source 194 arrives at the surface of the substrate under the same angle of incidence, with a known intensity. Because of the surface roughness, output beams 196 are randomly scattered and only a few beams are detected by the sensor 198. Therefore, if the input beam 192 has a predetermined intensity, the intensity loss, which is detected by the sensor 198, indicates the surface roughness. The ECMD process is continued to plate copper. As shown in FIG. 10B, as a copper layer completely fills the features and the copper layer 191 becomes planar, the intensity of the output beam 196 that is detected by the sensor 198 increases. Once the planar surface is obtained, the ECMD process is halted.

As shown in following FIGS. 11A–12C, the detection system and process of the present invention may be used with various ECMPR systems utilizing various WSID designs.

Figure 11A:
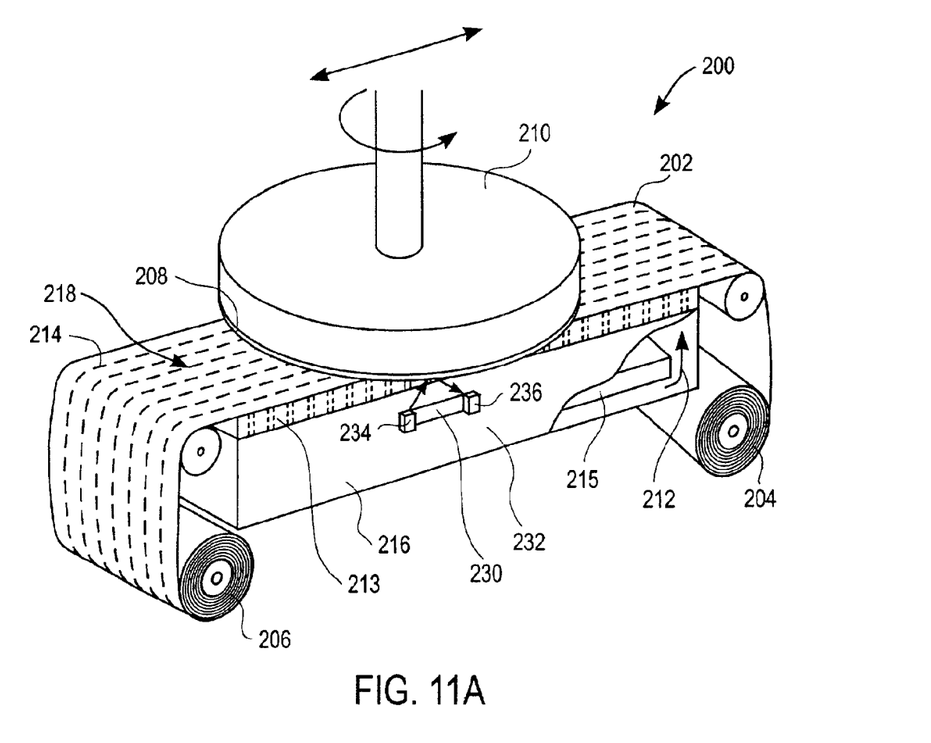
FIGS. 11A–11B are diagrams illustrating view of an exemplary ECMPR system using an exemplary belt WSID and that incorporates a detection system according to aspects of the present invention.
Figure 11B:
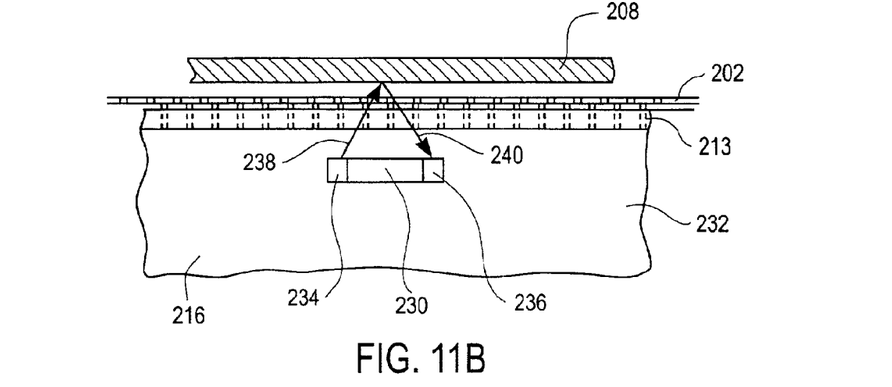

FIGS. 11A–11B shows an ECMPR system 200 using a belt WSID 202. An example of such belt WSID is described in U.S. application Ser. No. 10/288,558, entitled Electrochemical Mechanical Processing with Advancible Sweeper, filed Nov. 4, 2002, commonly owned by the assignee of the present invention. The belt WSID 202 is extended between a supply spool 204 and storage spool 206 and moved by a moving mechanism (not shown). During the process, a wafer 208 is held by the carrier head 210 in close proximity of the belt WSID such that a process solution 212, such as an electrolyte, flowing through a porous support plate 213 and channels 214 in the belt WSID wets the front surface of the wafer. The process solution and an electrode 215 that is immersed in the solution are kept in a container 216. The wafer processed over a predetermined area or a process area 218 of the belt WSID. As the belt is tensioned over an upper surface of the porous support plate, a top compressible layer 220 of the support plate pushes the belt upward. The process area is renewed by advancing the belt WSID such that a used process area is replaced by a fresh process area by rolling the used process area over the storage spool and thereby drawing fresh process area from the supply spool. During the process, the wafer carrier can move the wafer on or above the belt WSID laterally and rotate about the rotation axis z of the wafer carrier. The belt WSID of the present invention can also be moved laterally while the wafer is moved on it by the carrier head.

In this embodiment, a planarity detection system 230 may be secured on the side walls 232 of the container, below the belt WSID 104. The detection system 230 may have at least one light source 234 and at least one light sensor 236. The light source 234 generates an input optical beam 238. The input optical beam 238 is reflected by the front surface of the wafer and as an output optical beam 240. The output beam 240 is received by the sensor 236 of the detecting system 230.

Figure 12A:
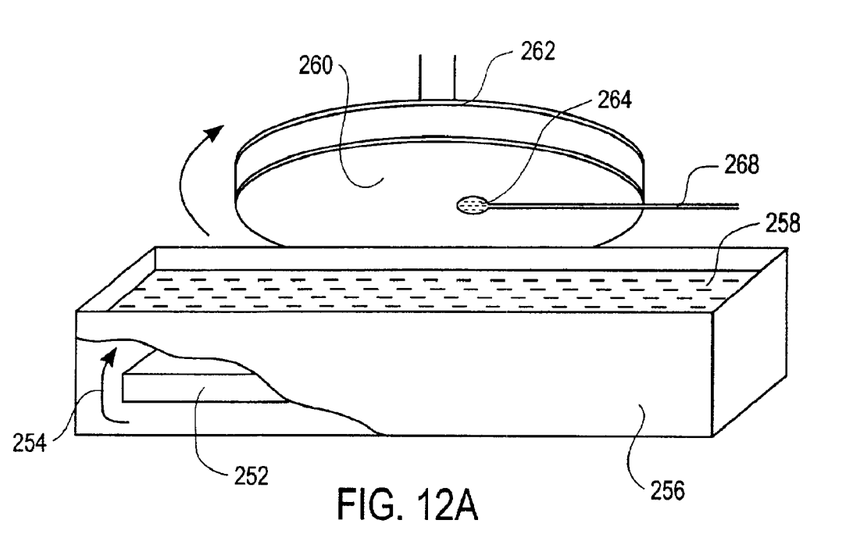
FIGS. 12A and 12C are diagrams illustrating views of an alternative exemplary ECMPR system using an exemplary wand WSID and that incorporates a detection system according to aspects of the present invention.
Figure 12B:
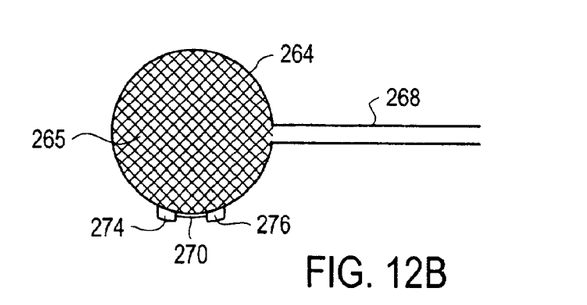
FIG. 12B illustrates the exemplary wand WSID according to FIGS. 12A and 12C.
Figure 12C:
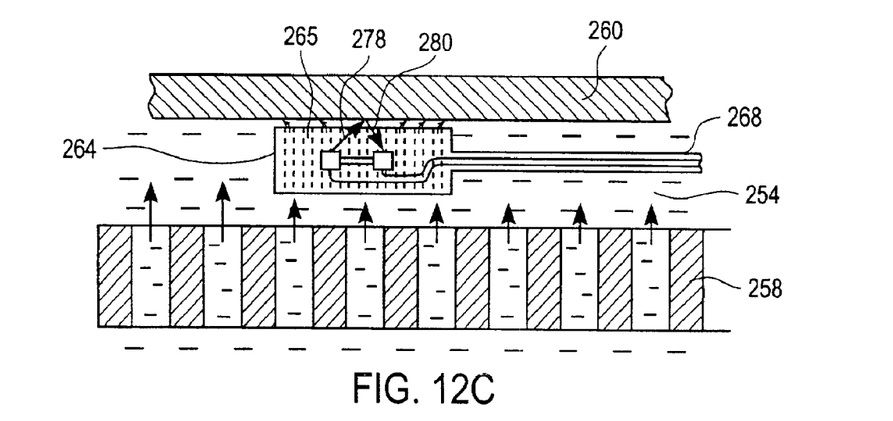

FIGS. 12A–12C illustrate an alternative ECMPR system 250 having an electrode 252 and an electrolyte 254 which are kept in a container 256. There may also be a diffuser 258 or shaping plate in between the electrode 252 and a wafer 260 to be processed (cathode) to assist in providing a uniform film deposition on the wafer 260. The shaping plate 258 will typically have openings that control fluid and electric field distribution over the wafer surface. The wafer 260 is held by a wafer holder 262. In this embodiment of the present invention, a wand WSID 264 is positioned in close proximity to the wafer. During processing, the WSID 264 makes contact with the top surface of the wafer, sweeping it so that during at least part of the time copper deposition or electroetching is performed. The WSID may have openings 265 in it allowing electrolyte flow. The WSID 264 may be of any size and shape and may have a handle 268 that moves the WSID on the wafer surface, preferably using programmable control, and can also be retractable so that it moves the sweeper entirely off of the area above the top surface of the wafer.

In this embodiment, a planarity detection system 270 may be secured on the WSID 264 as in the manner shown in FIGS. 12B–12C. The detection system 270 may have at least one light source 274 and at least one light sensor 276. The light source 274 generates an input optical beam 278. The input optical beam 278 is reflected by the front surface of the wafer and as an output optical beam 280. The output beam 280 is received by the sensor 276 of the detecting system 270.

In any of the above embodiments, the planar endpoint detection may be performed in a timed fashion to determine the approximate time span that the endpoint is reached for a specific process. This time information can be further used to monitor other process variables that has effect on the planarity of the layer such as additives in the process solution. For example, during the sequential processing of a group of similar substrates, the time required to reach the planarity endpoint can be experimentally determined as time $t_p$. If a process cycle for a specific substrate exceeds the time $t_p$ without reaching at the planarity endpoint, this may for example indicate variations in the process additives.

Although various preferred embodiments have been described in detail above, those skilled in the art will readily appreciate that many modifications of the exemplary embodiment are possible without materially departing from the novel teachings and advantages of this invention.

What is claimed is:

1. A method for detecting planarization of a top surface of a workpiece with features in an electrochemical mechanical deposition process that uses a solution containing a conductor therein and operates upon the top surface comprising:
   depositing the conductor to fill the features within the top surface of the workpiece using electrochemical mechanical deposition employing a workpiece surface influencing device, an applied potential and the solution;
   transmitting a beam of light onto the top surface of the workpiece to obtain a reflected beam of light, a characteristic of the reflected beam of light being altered by a top surface pattern that exists due to the features within the top surface of the workpiece; and
   detecting, during electrochemical mechanical deposition, a change in the characteristic of the reflected beam of light indicative of a degree of planarization to the top surface of the workpiece.

2. The method according to claim 1 further including the step of terminating the electrochemical mechanical deposition at a predetermined degree of planarization.

3. The method according to claim 2 further including a material removal step.

4. The method according to claim 3 wherein the material removal step performs chemical mechanical processing.

5. The method according to claim 3 wherein the material removal step performs electrochemical mechanical polishing and further comprises the steps:
   transmitting another beam of light onto the top surface of the workpiece to obtain another reflected beam of light; and
   detecting a change in a characteristic of the another reflected beam of light indicative of a another material on the top surface of the workpiece.

6. The method according to claim 5 wherein the beam of light and the another beam of light are from a same source.

7. The method according to claim 1 wherein the characteristic is intensity of the reflected beam of light.

8. The method according to claim 1 wherein the beam of light transmitted onto the top surface of the workpiece passes through the workpiece surface influencing device.

9. The method according to claim 8 wherein the characteristic is intensity of the reflected beam of light.

10. The method according to claim 1 wherein the beam of light transmitted onto the top surface of the workpiece is adjacent to the workpiece surface influencing device.

11. The method according to claim 10 wherein the characteristic is intensity of the reflected beam of light.

12. A method for detecting planarization of a top surface of a workpiece in an electrochemical mechanical deposition process that uses a solution containing a conductor therein, the method comprising:
   electrochemically mechanically depositing the top surface of the workpiece using a workpiece surface influencing device, an applied potential and the solution to deposit material onto the top surface;
   transmitting a beam of light onto the top surface of the workpiece to obtain a reflected beam of light; and
   detecting, during electromechanical depositing, a change in a characteristic of the reflected beam of light indicative of a degree of planarization to the top surface of the workpiece.

13. The method according to claim 12 further including the step of terminating the electrochemical mechanical process at a predetermined degree of planarization on of the top surface.

14. The method according to claim 13 further including the step of removing at least a portion of the material.

15. The method according to claim 14 wherein the step of removing performs chemical mechanical processing.

16. The method according to claim 14 wherein the step of removing performs electrochemical mechanical polishing and further comprises the steps:
   transmitting another beam of light onto the top surface of the workpiece to obtain another reflected beam of light; and
   detecting a change in a characteristic of the another reflected beam of light indicative of a another material on the top surface of the workpiece.

17. The method according to claim 14 wherein the step of removing performs electrochemical mechanical polishing.

18. The method according to claim 12 wherein portions of the top surface is conductive and the step of electrochemically mechanically processing deposits a conductor into features disposed in the top surface of the workpiece.

19. A method for detecting planarization of a top surface of a workpiece having a plurality of features comprising:
   depositing the conductor to fill the features within the top surface of the workpiece using electrochemical mechanical deposition; and
   obtaining a signal indicative of a degree of planarity of the top surface during electrochemical mechanical deposition.

20. The method according to claim 19 wherein to the step of obtaining comprises:
   transmitting a beam of light onto the top surface of the workpiece to reflect the beam of light; and
   detecting a characteristic of a reflected beam of light from the top surface; and transforming the characteristic into a signal which corresponds to the degree of planarity of the top surface.

21. The method according to claim 20 further including the step of terminating the step of depositing when the planarity of the top surface reaches a predetermined degree.

22. The method according to claim 21 further including a material removal step.

23. The method according to claim 22 wherein the material removal step performs electrochemical mechanical processing.

24. The method according to claim 22 wherein the material removal step includes:

transmitting another beam of light onto the top surface of the workpiece to obtain another reflected beam of light; and detecting a change in a characteristic of the another reflected beam of light indicative of another material on the top surface of the workpiece.

25. The method according to claim 20 wherein the characteristic is intensity of the reflected beam of light.

26. The method according to claim 25 wherein the intensity increases as the surface of the workpiece becomes more planar.

27. The method according to claim 1 wherein the conductor is copper.

28. The method according to claim 5 wherein the conductor is copper.

29. The method according to claim 5 wherein the another material is a barrier material.

30. The method according to claim 7 wherein the intensity increases as the degree of planarization increases.

31. The method according to claim 9 wherein the intensity increases as the degree of planarization increases.

32. The method according to claim 14 wherein the step of removing performs chemical mechanical polishing and further comprises the steps:

transmitting another beam of light onto the top surface of the workpiece to obtain another reflected beam of light; and detecting a change in a characteristic of the another reflected beam of light indicative of another material on the top surface of the workpiece.

\* \* \* \* \*